United States Patent
Chmielewski et al.

(10) Patent No.: US 7,288,938 B2
(45) Date of Patent: Oct. 30, 2007

(54) CONNECTION SYSTEM FOR SPLIT-TOP RF COILS

(75) Inventors: Thomas Chmielewski, Willoughby Hills, OH (US); John T. Carlon, Madison, OH (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 18 days.

(21) Appl. No.: 10/560,216

(22) PCT Filed: May 28, 2004

(86) PCT No.: PCT/IB2004/001843

§ 371 (c)(1),
(2), (4) Date: Dec. 9, 2005

(87) PCT Pub. No.: WO2004/111670

PCT Pub. Date: Dec. 23, 2004

(65) Prior Publication Data

US 2007/0090840 A1    Apr. 26, 2007

Related U.S. Application Data

(60) Provisional application No. 60/478,296, filed on Jun. 13, 2003.

(51) Int. Cl.
*G01V 3/00* (2006.01)
(52) U.S. Cl. ...................... 324/318; 324/322
(58) Field of Classification Search ........ 324/300–322, 324/309, 307; 600/410, 422
See application file for complete search history.

(56) References Cited

U.S. PATENT DOCUMENTS

| | | | | |
|---|---|---|---|---|
| 5,075,624 | A | 12/1991 | Bezjak | 324/318 |
| 5,274,332 | A | 12/1993 | Jaskolski et al. | 324/318 |
| 5,551,430 | A * | 9/1996 | Blakeley et al. | 600/410 |
| 5,574,373 | A * | 11/1996 | Pausch et al. | 324/318 |
| 5,664,568 | A * | 9/1997 | Srinivasan et al. | 600/422 |
| 6,011,393 | A * | 1/2000 | Kaufman et al. | 324/318 |
| 6,141,580 | A | 10/2000 | Hayashi et al. | 600/422 |
| 6,144,203 | A | 11/2000 | Richard et al. | 324/318 |
| 6,198,961 | B1 * | 3/2001 | Stern et al. | 600/422 |
| 6,316,941 | B1 * | 11/2001 | Fujita et al. | 324/318 |
| 6,577,888 | B1 * | 6/2003 | Chan et al. | 600/422 |

FOREIGN PATENT DOCUMENTS

| | | |
|---|---|---|
| DE | 39 32 648 A1 | 4/1991 |
| EP | 0 471 509 A2 | 2/1992 |
| EP | 0 758 091 A1 | 2/1997 |
| EP | 0 924 530 A2 | 6/1999 |

* cited by examiner

*Primary Examiner*—Brij B. Shrivastav

(57) ABSTRACT

A split-top RF coil is provided. The split-top RF coil includes a first housing (80) having a first RF coil portion (41) disposed therein and a second housing (84) having a second RF coil portion (42) disposed therein. A plurality of slides (100) disposed on at least one of the housings and a plurality of slide tracks (101) are disposed the housing opposite the slides for receiving the slides. The first and second housings are mechanically coupled via the slides and slide tracks. The RF coil also includes a plurality of electric connector pins (110) disposed on at least one of the housings and a plurality of pin receivers (111) disposed on the housing opposite the pins for receiving the conductor pins. Electric connections between the first and second coil RF coil portions are made via the pins and receivers.

15 Claims, 9 Drawing Sheets

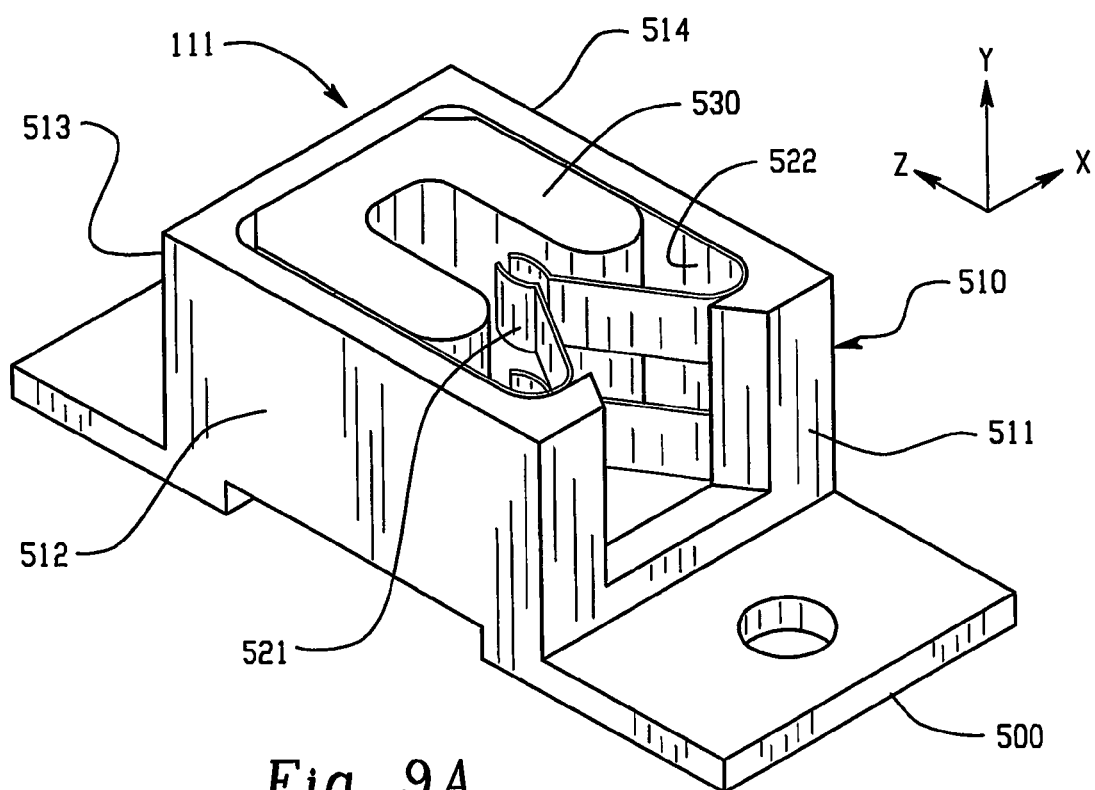
Fig. 9A
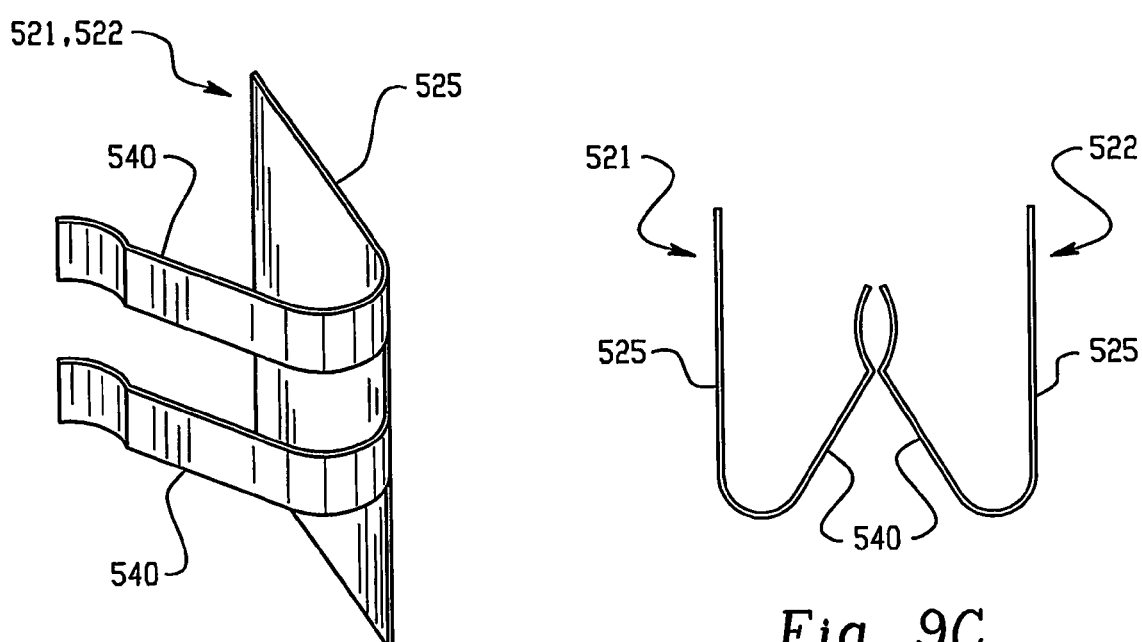
Fig. 9B
Fig. 9C

CONNECTION SYSTEM FOR SPLIT-TOP RF COILS

CROSS REFERENCE TO RELATED APPLICATIONS

This application claims the benefit of U.S. provisional application Ser. No. 60/478,296 filed Jun. 13, 2003, which is incorporated herein by reference.

The present invention relates to the magnetic resonance arts. It finds particular application in conjunction with split-top insertable radio frequency coils for magnetic resonance imaging of the head and neck and will be described with particular reference thereto. It is to be appreciated, however, that the present invention will also find application in other multiple coil techniques, spectroscopy, phased array coils, imaging for other than medical diagnostic purposes, and the like.

Conventionally, magnetic resonance imaging systems generate a strong, uniform static magnetic field $B_0$ in a free space or bore of a magnet. This main magnetic field polarizes the nuclear spin system of an object in the bore to be imaged. The polarized object then possesses a macroscopic magnetic moment vector pointing in the direction of the main magnetic field. In a superconducting main magnet assembly, annular magnets generate the static magnetic field $B_0$, along a longitudinal or z-axis of the cylindrical bore.

To generate a magnetic resonance signal, the polarized spin system is excited by applying a radio frequency field $B_1$, perpendicular to the z-axis. Typically, a radio frequency coil for generating the radio frequency field is mounted inside the bore surrounding the sample or patient. In a transmission mode, the radio frequency coil is pulsed to tip the magnetization of the polarized sample away from the z-axis. As the magnetization precesses around the z-axis back toward alignment, the precessing magnetic moment generates a magnetic resonance signal which is received by the radio frequency coil in a reception mode.

For imaging, a magnetic field gradient coil is pulsed for spatially encoding the magnetization of the sample. Typically, the gradient magnetic field pulses include gradient pulses pointing in the z-direction but changing in magnitude linearly in the x, y, and z-directions, generally denoted $G_x$, $G_y$, and $G_z$, respectively. The gradient magnetic fields are typically produced by a gradient coil which is located inside the bore of the magnet and outside of the radio frequency coil.

Conventionally, when imaging the torso, a whole body radio frequency coil is used in both transmit and receive modes. By distinction, when imaging the head, neck, shoulders, or an extremity, the whole body coil is often used in the transmission mode to generate the uniform $B_1$ excitation field and a local coil is used in the receive mode. Placing the local coil close to the imaged region improves the signal-to-noise ratio and the resolution. In some procedures, local coils are used for both transmission and reception. One drawback to local coils it that they tended to be relatively small and it is difficult to position a subject inside the coil.

Accordingly, as shown in U.S. Pat. No. 5,664,568, local coil assemblies have been built in mechanical housings which are openable such that an upper portion, or housing, of the coil is removable as a unit from a lower portion, or housing, of the coil to facilitate patient access.

With respect to mechanically coupling the upper and lower housing portions it is also common that a hinged mechanical latch holds the portions of the insertable coil assembly together. Such a hinged latch is shown in FIGS. 2A and 2B. With respect to electrically coupling the upper and lower housing portions, typical coils use an axial connector set as shown in FIG. 3.

The connectors utilized in the foregoing techniques have several disadvantages. If the clearance between the upper and lower housings is minimized, the housings can seize or collide when the top half of the coil is inserted or removed. Seizing is undesirable since it can compromise or damage the electrical connections and can make mechanical positioning difficult. However, if the clearance becomes too great, there becomes a greater chance of damaging the connectors because of a poor misalignment. Another disadvantage of this type of connection is that there is usually a minimum of engagement distance before the connectors are engaged which increases the chance of damaging the connector.

Those skilled in the art will, upon reading and understanding the appended description, appreciate that aspects of the present invention address the above and other matters.

In accordance with one aspect of the invention, a split-top RF coil for use in magnetic resonance imaging is provided. The split-top coil includes a first housing having a first RF coil portion disposed therein, a second housing having a second RF coil portion disposed therein, a plurality of slides disposed on at least one of the first and second housings, and a plurality of slide tracks disposed on at least one of the first and second housings such that said tracks are opposite from the slides, the tracks for receiving the slides for mechanically coupling the first and second housings.

In accordance with another limited aspect of the invention, at least one of the plurality of slide tracks comprises a ramp portion for guiding movement in a first direction between the first and second housings as the first and second housings are moved relative to one another in a second direction, the first and second directions being substantially perpendicular to one another.

In accordance with another limited aspect of the invention, the split-top RF coil also includes a plurality of electric connector pins disposed on at least one of the first and second housings, and a plurality of pin receivers disposed on at least one of the first and second housings such that the pin receivers are opposite from the conductor pins, the pin receivers for receiving the conductor pins for electrically connecting the first and second coil RF coil portions.

In accordance with another limited aspect of the invention, the plurality of pin receivers comprise a plurality of prongs for receiving the connector pins.

In accordance with another limited embodiment of the invention, the RF coil has a longitudinal axis and mechanical and electrical connections between the first and second housings are made by sliding the first and second housings with respect to one another in the direction of the longitudinal axis.

In accordance with another aspect of the invention, a split-top RF coil for use in magnetic resonance imaging having a first axis is provided. The RF coil includes a first housing having a first RF coil portion disposed therein, a second housing having a second RF coil portion disposed therein, mechanical coupling means for mechanically coupling the first and second housings by sliding the first housing with respect to the second housing in the direction of the first axis, and electrical coupling means for electrically coupling the first and second RF coil portions by sliding the first housing with respect to the second housing in the direction of the first axis.

In accordance with a more limited aspect of the invention, the mechanical coupling means includes a plurality of slides disposed on at least one of the first and second housings, and a plurality of slide tracks disposed on at least one of the first and second housings such that said tracks are opposite from the slides, the tracks for receiving the slides for mechanically coupling the first and second housings.

In accordance with another limited aspect of the invention, at least one of the plurality of slide tracks includes a ramp portion for guiding movement in a first direction between the first and second housings as the first and second housings are moved relative to one another in a second direction, the first and second directions being substantially perpendicular to one another.

In accordance with another limited aspect of the invention, the electrical coupling means includes a plurality of electric connector pins disposed on at least one of the first and second housings, and a plurality of pin receivers disposed on at least one of the first and second housings such that the pin receivers are opposite from the conductor pins, the pin receivers for receiving the conductor pins for electrically connecting the first and second coil RF coil portions.

In accordance with another limited aspect of the invention the plurality of pin receivers include a plurality of prongs for receiving the connector pins.

In accordance with another limited aspect of the invention the first axis is defined by a longitudinal axis of the RF coil.

In accordance with another aspect of the invention a magnetic resonance imaging apparatus is provided. The magnetic resonance imaging apparatus includes a magnet for generating a main magnetic field within an examination region a gradient coil assembly for generating gradient magnetic fields within the examination region, and a split-top RF coil for at least one of transmitting and receiving RF signals within the examination region. The split-top RF coil includes a first housing having a first RF coil portion disposed therein, a second housing having a second RF coil portion disposed therein, a plurality of slides disposed on at least one of the first and second housings, a plurality of slide tracks disposed on at least one of the first and second housings in opposition to the plurality of slides for receiving the plurality of slides whereby the first and second housings are mechanically coupled, a plurality of electrical connector pins disposed on at least one of the first and second housings, and a plurality of pin receptors disposed on at least one of the first and second housing in opposition to the plurality of connector pins for receiving the plurality of pins whereby electrical connections are made between the first and second RF coil portions.

In accordance with another limited aspect of the invention at least one of the plurality of slide tracks includes a ramp portion for guiding movement in a first direction between the first and second housings as the first and second housings are moved relative to one another in a second direction, the first and second directions being substantially perpendicular to one another.

In accordance with another limited aspect of the invention the plurality of pin receivers include a plurality of prongs for receiving the connector pins and making electrical connection therewith.

In accordance with another limited aspect of the invention the RF coil has a longitudinal axis and mechanical and electrical connections between the first and second housings are made by sliding the first and second housings in the direction of the longitudinal axis.

One advantage of an embodiment of the invention is that it facilitates proper mating of electrical connectors between coil portions of a split-top RF coil.

Another advantage of an embodiment of the invention is that it provides reliable mating of electrical connectors between coil portions of a split-top RF coil.

Another advantage of an embodiment of the invention is that mechanical engaging and disengaging the housings of a split-top coil are facilitated.

Another advantage of an embodiment of the invention is that it facilitates a secure mechanical connection between portions of a split-top coil.

Still further advantages of the present invention will become apparent to those of ordinary skill in the art upon a reading and understanding of the following description of the preferred embodiments.

The invention may take form in various components and arrangements of components, and in various steps and arrangements of steps. The drawings are only for purposes of illustrating a preferred embodiment and are not to be construed as limiting the invention.

FIG. 9A is a perspective view of an electrical connector pin receiver;

FIG. 9B is a perspective view of a female receiver;

FIG. 9C is a top view of a female receiver;

Figure 1:
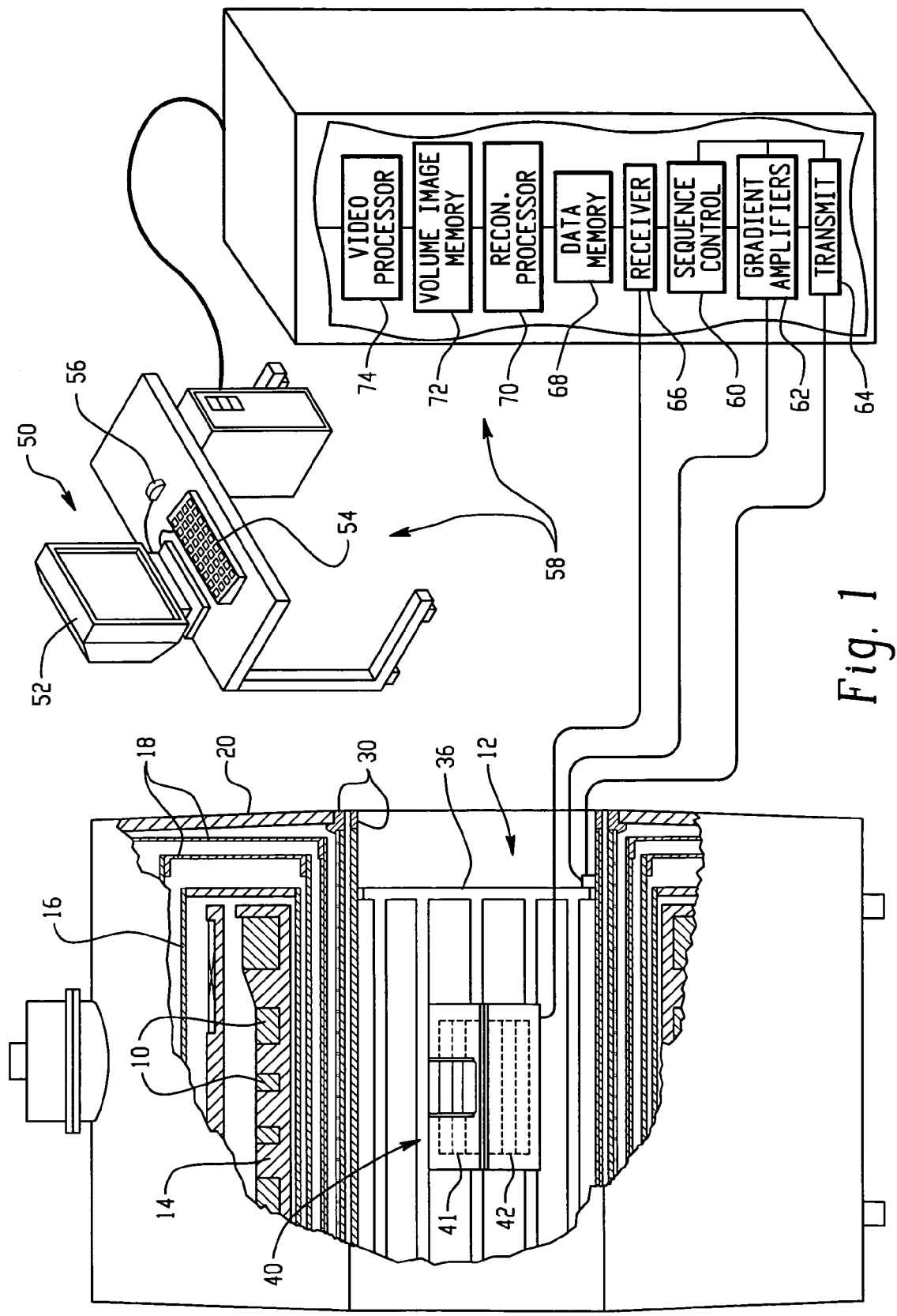
FIG. 1 is a schematic drawing of a magnetic resonance apparatus with a split-top coil disposed therein.
Figure 2A:
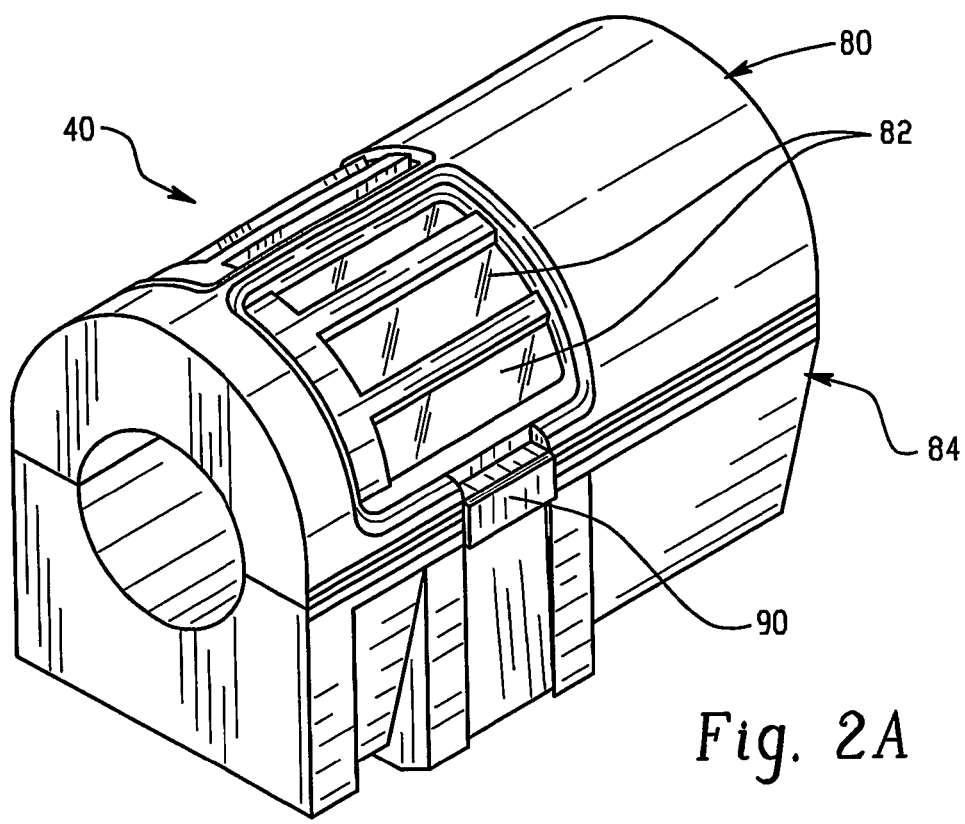
FIG. 2A is an illustration of a split-top coil that employs a hinged latch for securing upper and lower portions of the coil to each other.
Figure 2B:
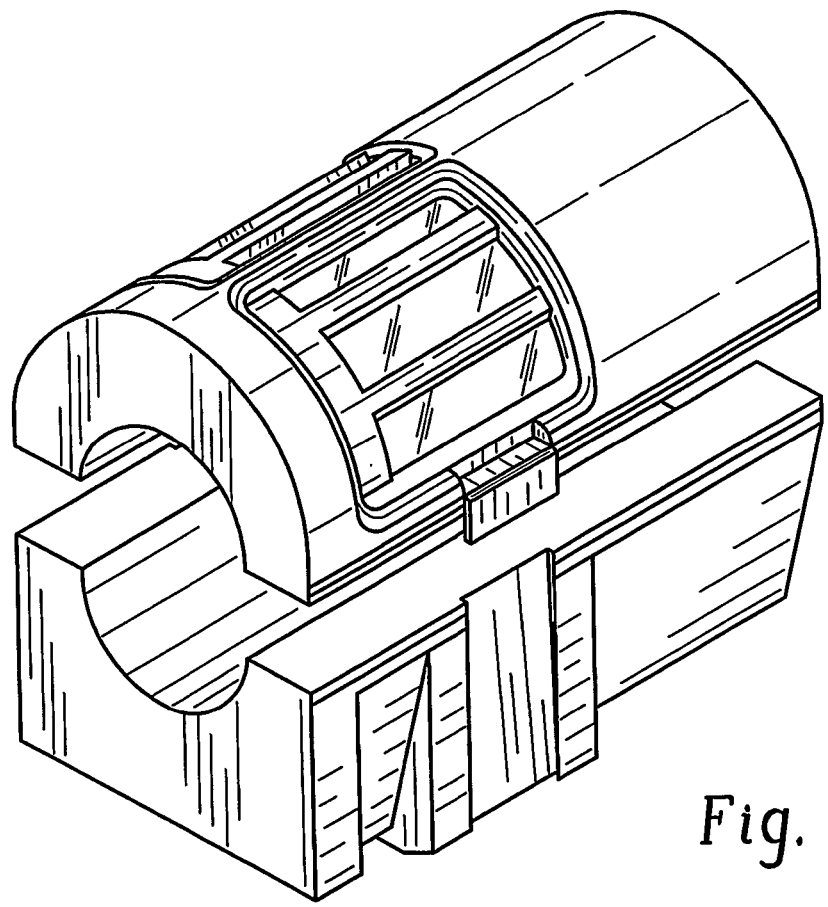
FIG. 2B is an illustration of a split-top coil that employs a hinged latch showing the latch in an open position.
Figure 3:
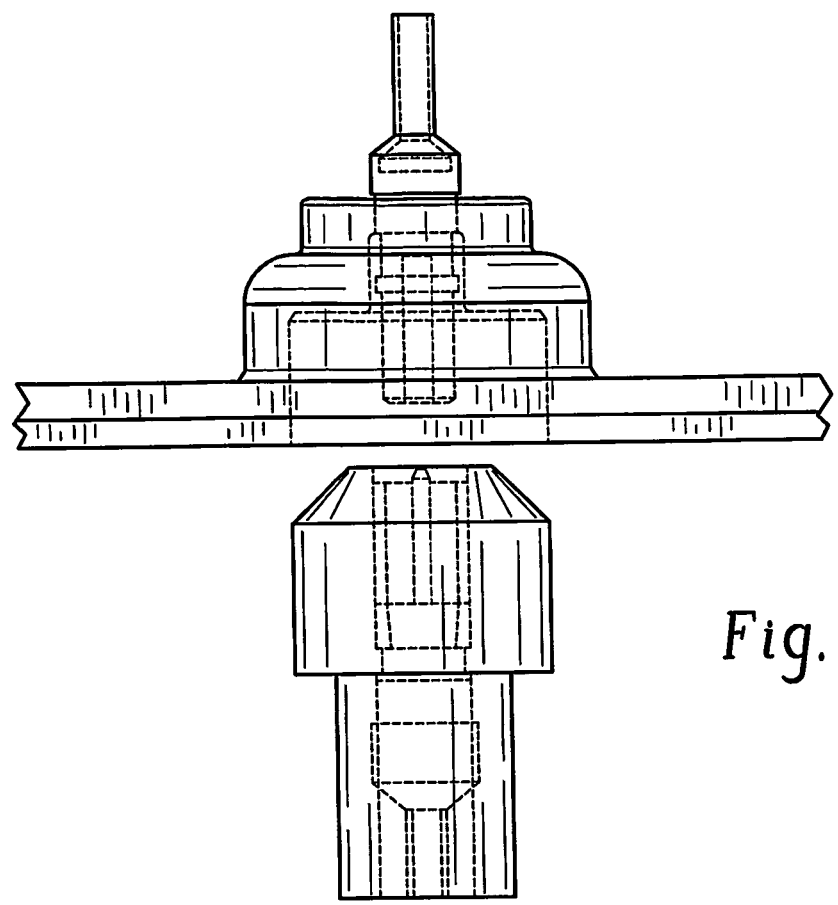
FIG. 3 is an illustration of an electrical connector that provides electrical connection between upper and lower portions of a split-top coil.

With reference to FIG. 1, a magnetic resonance system 11 is shown. The MR system includes a plurality of primary magnetic coils 10 which generate a uniform, temporally constant magnetic field $B_0$ along a longitudinal or z-axis of a central bore, or examination region 12. In a superconducting embodiment, the primary magnet coils are supported by a main magnet former 14 and received in a toroidal helium vessel or can 16. The vessel is filled with helium to maintain the primary magnet coils at superconducting temperatures.

The can is surrounded by a series of cold shields 18 which are supported in a vacuum dewar 20. Of course, annular resistive magnets, C-magnets, and the like are also contemplated.

In the embodiment shown, a gradient coil assembly 30 is provided. The gradient coil assembly includes x, y, and z-coils mounted along the bore 12 for generating gradient magnetic fields, $G_x$, $G_y$, and $G_z$. A whole body radio frequency coil 36 can be mounted inside the gradient coil assembly 30.

An insertable, or local, radio frequency coil 40 is removably mounted in the bore in the examination region 12. In FIG. 1, the insertable radio frequency coil is a split-top head coil, such as a birdcage coil, for imaging a subject's head. It is to be understood that the insertable RF coil 40 could be any type of split RF coil wherein the coil includes at least two portions, which are detachable from each other.

An operator interface and control station includes a human-readable display, such as a video monitor 52, and an operator input means including a keyboard 54, a mouse 56, a trackball, light pen, or the like. A computer control and reconstruction module 58 includes hardware and software for enabling the operator to select among a plurality of preprogrammed magnetic resonance sequences that are stored in a sequence control memory. A sequence controller 60 controls gradient amplifiers 62 connected with the gradient coil assembly 30 for causing the generation of the $G_x$, $G_y$, and $G_z$ gradient magnetic fields at appropriate times during the selected gradient sequence and a digital transmitter 64 which causes a selected one of the whole body 36 and insertable radio frequency coils 40 to generate $B_1$ radio frequency field pulses at times appropriate to the selected sequence.

Resonance signals received from the examination region 12 by the coil 40 are demodulated by a digital receiver 66 and stored in a data memory 68. The data from the data memory are reconstructed by a reconstruction or array processor 70 into an image representation that is stored in an image memory 72. A video processor 74 under operator control converts selected portions of the image representation into slice images, projection images, perspective views, or the like as is conventional in the art for display on the video monitor.

Figure 4:
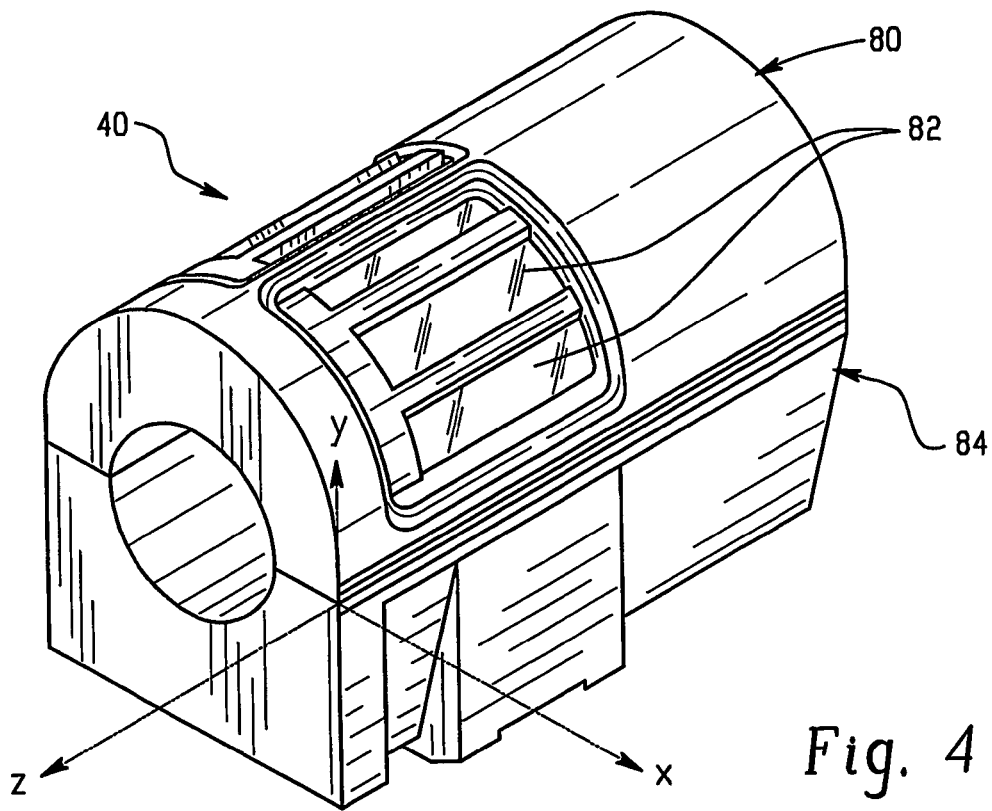
FIG. 4 is an illustration of a split-top coil, in a closed position, in accordance with the present invention.

Turning to FIG. 4, a split-top RF coil 40 can be seen. A first, or upper, half of the coil is housed in a first, or upper, housing portion 80. To reduce claustrophobic effects on the patient, the upper housing portion optionally has windows 82 between adjacent legs of the birdcage coil. A second, or lower, half of the coil is housed in a second, or lower, housing portion 84. The upper housing portion is removably coupled to the lower housing portion 84 which rests on a patient support or is otherwise disposed in the examination region 12.

The upper and lower coil portions include formers on which copper foil coils are supported, e.g., fiber reinforced plastic. The coil formers are fastened to inner portions of the housing for rigidity and for maintaining the coil's shape and structural integrity. The inner housings are contoured to fit the anatomy under investigation. The outer housings cover the internal parts and electronic assemblies, as well as provide mechanical strength to the coil construction. Between the inner and outer housings, skeletons are provided to add rigidity to the coil structure.

Figure 5:
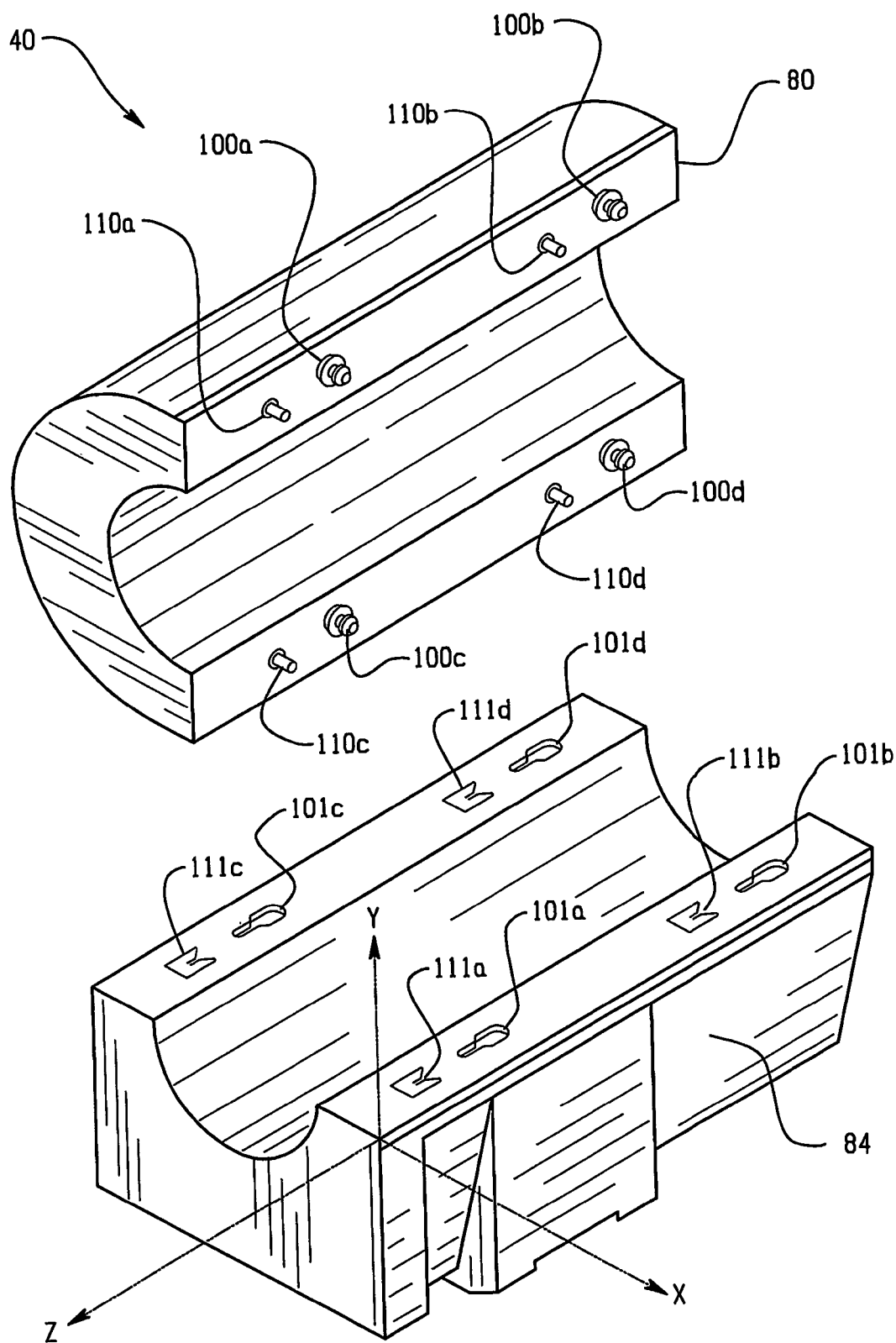
FIG. 5 is an illustration of a split-top coil, in an open position, in accordance with the invention.

Typically, it is desirable that the upper and lower housings 80, 84 are mechanically coupled and that the coil portions disposed in the housings are electrically connected to each other. For example, in the case of a birdcage coil, it is desirable that the end rings are electrically coupled. Accordingly, the upper and lower housing portions 80, 84 are mechanically coupled by slides 100 and slide tracks 101 and electrically connected via pins 110 and pin receivers 111 as shown in FIG. 5.

Turning to FIGS. 6A-7D, a mechanical slide 100 and slide track 101 can be seen. In one embodiment the slides and tracks are made, or coated with material having a relatively low coefficient of friction, such as polytetrafluoroethylene (PTF). With particular attention to the embodiment shown in FIGS. 6A-B, each slide 100 includes a slide mounting portion 200, a slide stem 210, having a width W1 and a length L1, which extends from the slide mounting portion. The slide also includes a slide knob 220, having a width W2 and a length L2, which is disposed at the end of the slide stem opposite from the mounting portion. The slide mounting portion includes a mounting surface 221 and the slide knob 220 includes a first, or lower, knob surface 221 and a second, or upper, knob surface 222.

Figure 6A:
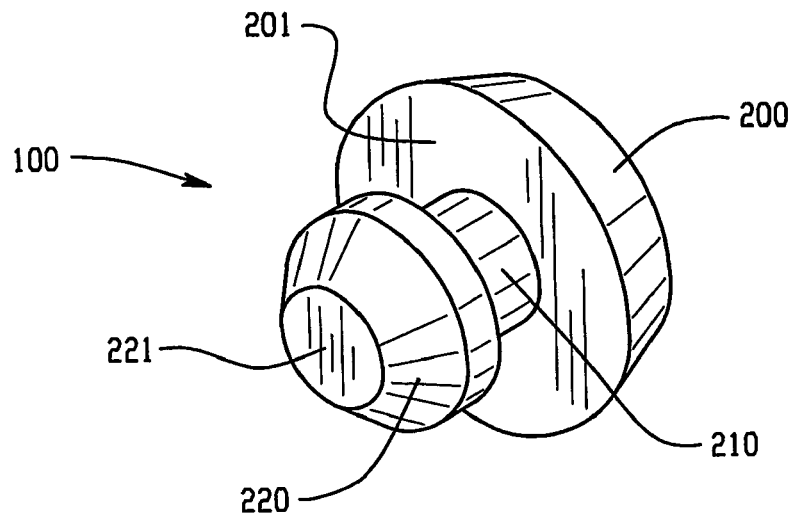
FIG. 6A is a perspective view of a slide used for coupling upper and lower portions of a split-top coil.
Figure 6B:
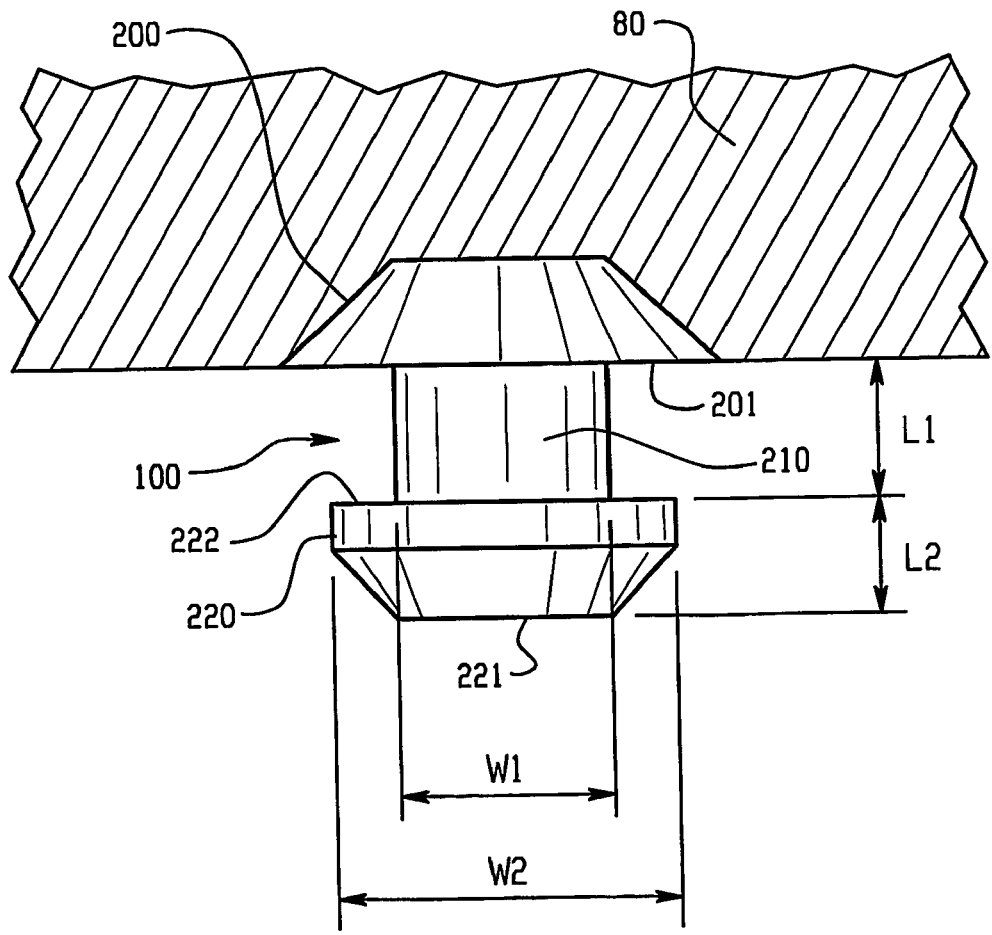
FIG. 6B is a side view of a slide used for coupling upper and lower portions of a split-top coil.

As shown in FIG. 6B, the slide 100 is disposed in the upper housing 80 such that the mounting surface 201 is generally flush with the upper housing and the stem 210 and knob 221 extend therefrom.

Turning to FIGS. 7A-D, a slide track 101 can be seen. In the embodiment shown, each slide track includes a first, or lower, slotted track portion 300, having a thickness T1 and a second, or upper, key-holed track portion 310, having a thickness T2, disposed adjacent to the slotted track portion. The slotted track portion 300 includes a generally oval slot 315 and the key-holed track portion 310 includes a generally key-hole shaped aperture having a relatively wide section 320 and a relatively narrow section 330. The width of the slot 315 in the lower track portion 300 is approximately equal to the width of the relatively wide section 320 of the upper track portion 310.

The upper key-holed track portion 310 also includes a first, or upper surface 311 and a second, or lower surface 312. The lower surface 312 includes the portion of the relatively narrow section 320 of the upper track portion that extends over the slot 315 of the lower track portion 300.

Figure 7A:
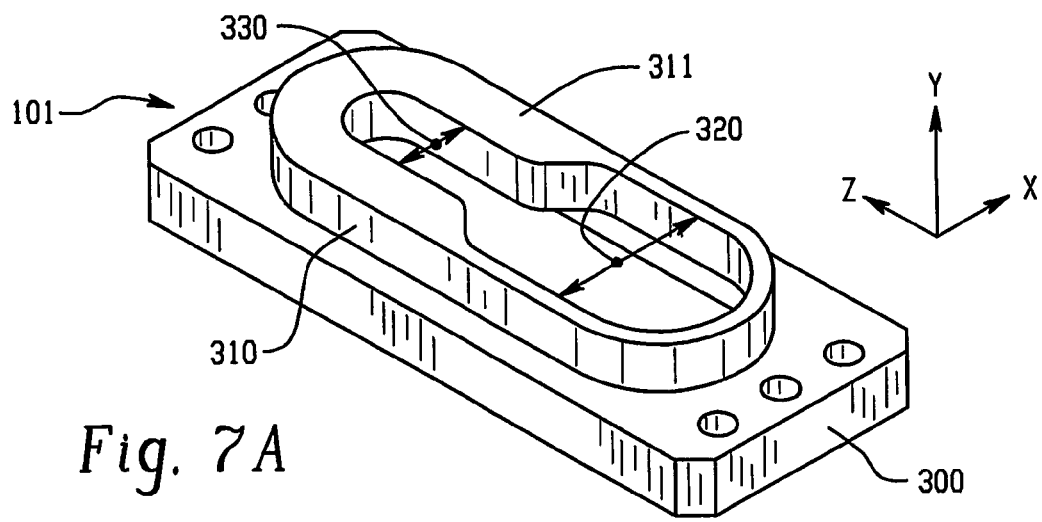
FIG. 7A is a perspective view of a slide track for coupling upper and lower portions of a split-top coil.
Figure 7B:
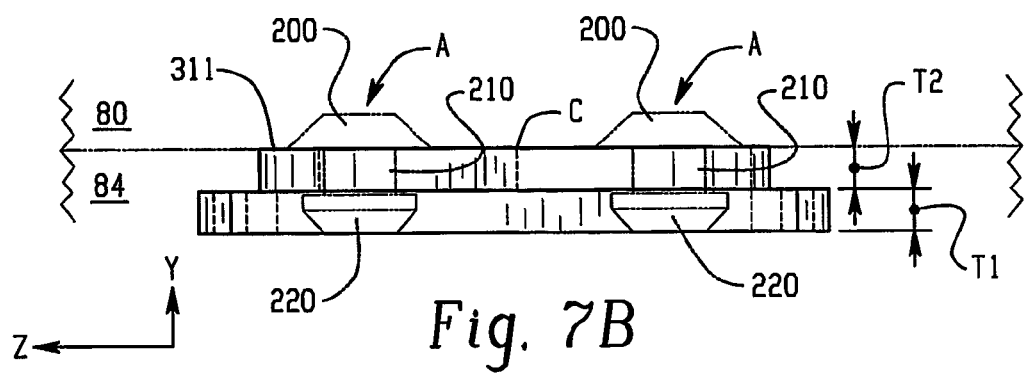
FIG. 7B is a side view of a slide track for coupling upper and lower portions of a split-top coil.

As shown in FIG. 7B, the slide track 101 is disposed in the lower housing 84 such that the upper surface 311 is generally flush with the lower housing 84, with the slide track being 101 situated therein.

Turning to FIGS. 8A to 9C, an electric connector pin 110 and pin receivers 111 are shown. With particular attention to FIGS. 8A and 8B, the electric connector pin includes a mounting portion 410 and a male extension portion 420. The mounting portion 410 includes a generally cylindrical body. The mounting portion 410 is disposed in the upper housing 80 and is electrically connected to the upper half of the RF coil 41 as shown in FIG. 8B. The male extension portion 420 has a width, or diameter, W3 and a length L3 and is coupled to the mounting portion 410. The male extension 420 extends away from the upper housing 80 in generally the y-direction, as shown in FIG. 8B.

Turning to FIGS. 9A-9D, a pin receiver 111 is shown. The pin receiver includes a base portion 500 and a receiving portion 510 coupled to the base portion. The receiving portion 510 includes first, second, third, and fourth walls 511, 512, 513, 514 arranged and interconnected in a rectangular structure. The first, or receiving wall, 511 is disposed in the xy-plane and includes an aperture, or material-free region, dimensioned to receive the male extension portion 420. A set of electrically conductive female receivers 521, 522 and a retainer 530 are disposed within the receiving portion 510.

As shown in more detail in FIG. 9B, each set of female receivers 521, 522 includes a back-plate 525 and a pair of prongs 540 which extend therefrom. The back-plate of the first female receiver 521 is attached to the second wall 512 of the receiving portion 510 such that the prongs 540 of the first female receiver 521 extend into the receiving portion 510. The back-plate of the second female receiver 522 is attached to the third wall of the receiving portion 510 such that the prongs 540 of the second female receiver extend into the receiving region and oppose those of the first female receiver as shown in FIG. 9C.

The retainer 530 is generally C-shaped and is disposed along the third wall 513 of the receiving portion 510 so that it faces the first wall 513. As can be seen in FIG. 9A the retainer is arranged so that the distal ends of the opposing female receiver prongs extend into the retainer 530.

As shown in FIG. 9C, the pin receiver 111 is mounted on the lower RF coil housing 84. The female receivers 521, 522 are electrically connected to the lower half of the RF coil 42 through the lower housing.

Figures 7C, 7D:
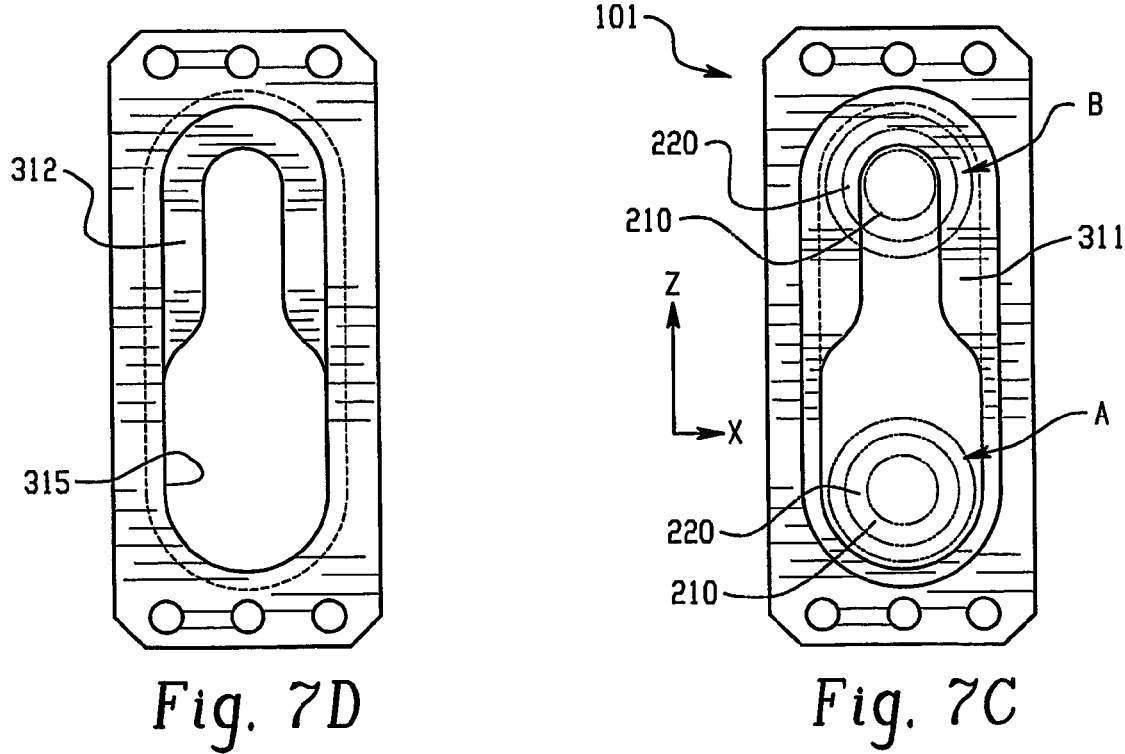
FIG. 7C is a top view of a slide track for coupling upper and lower portions of a split-top coil.
FIG. 7D is a bottom view of a slide track for coupling upper and lower portions of a split-top coil.
Figure 8A:
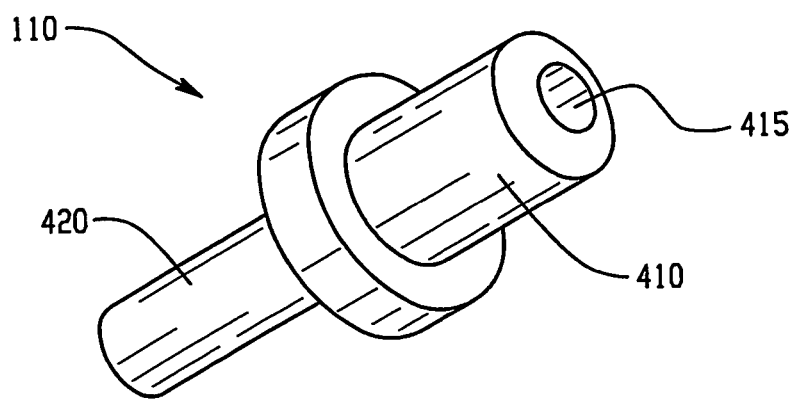
FIG. 8A is a perspective view of an electrical connector pin.
Figure 8B:
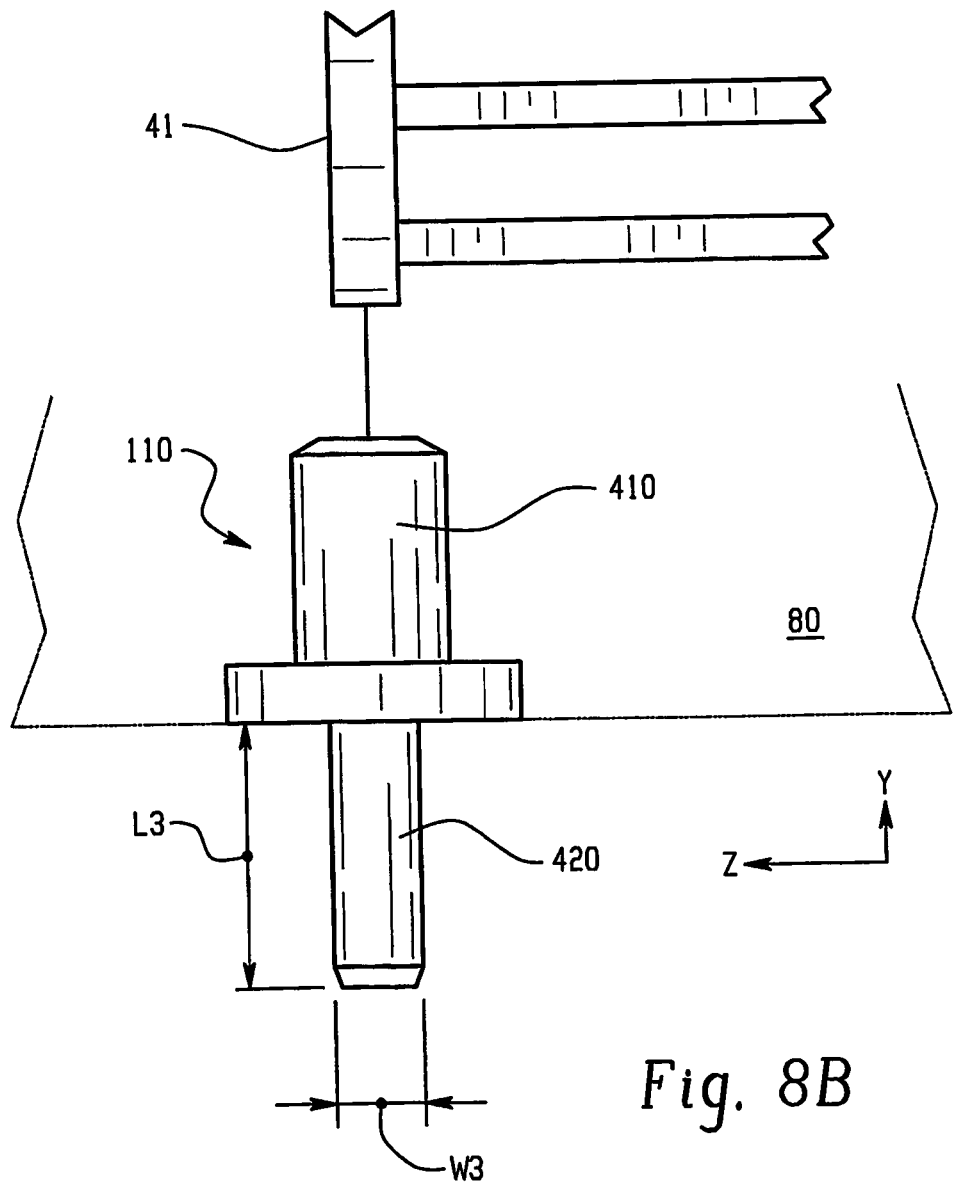
FIG. 8B is an illustration of a connector pin disposed in an insertable RF coil housing.
Figure 9D:
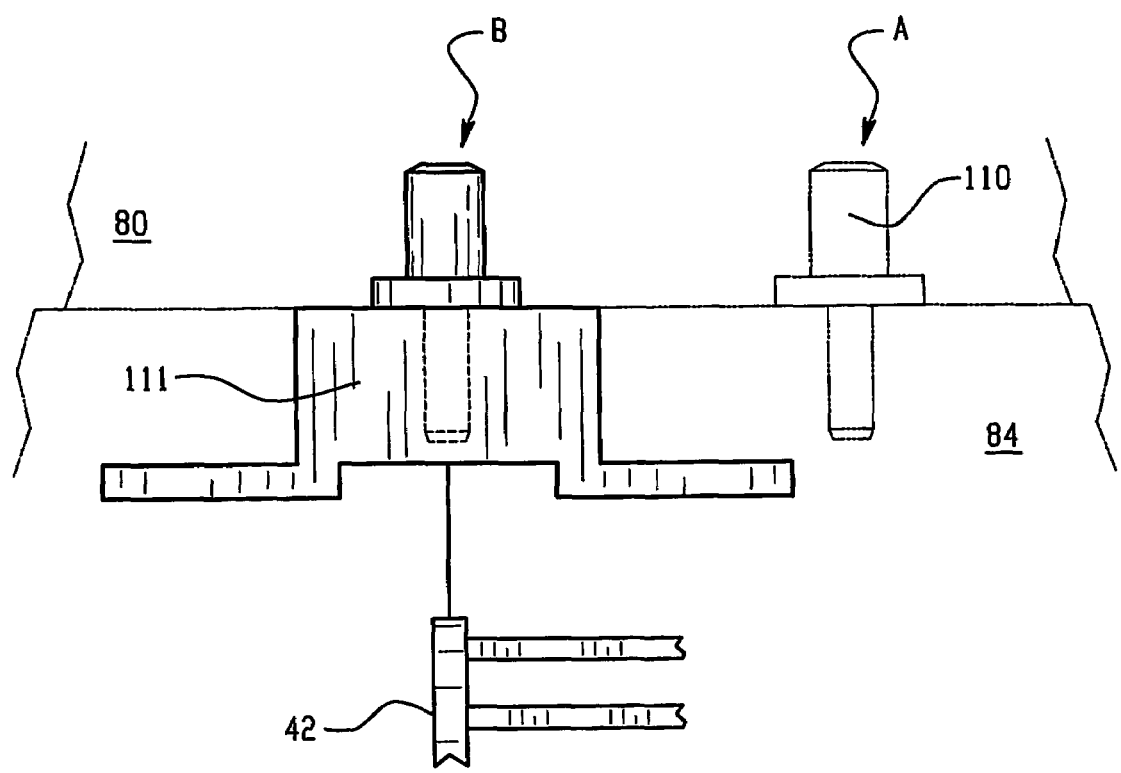
FIG. 9D is an illustration of electrical coupling between upper and lower portions of an insertable RF coil.

In operation, the mechanical and electrical connections are made by positioning the upper housing 80 with respect to the lower housing portion 84 in the x, y, and z directions such that the slides 100a, 100b, 100c, 100d are received by respective relatively wide apertures 320 of the slide tracks, 101a, 101b, 100c, 101d, as shown by an initiating position A in FIGS. 7B and 7C. Then, by sliding the upper housing 80 in the z-direction with respect to the lower housing 84, the slides 100 are mechanically secured within the tracks 101, as shown in position B.

Turning again to FIGS. 6A-7D, the mechanical coupling results from the dimensions of the slides 100 and slide tracks 101 being such that a secure fit is made between the slides and tracks when the upper housing 80 is in the secured position B. For example, in one embodiment, the length L1 of the slide stem 210 is slightly greater than the thickness T2 of the upper keyhole portion 310 of the slide track 101. Accordingly, when in the secured position B, forces of friction between: 1) the slide mounting surface 201 and the upper surface 311 of the upper keyhole portion 310; and 2) the slide knob upper surface 222 and the lower surface 312 of the upper keyhole portion 310, hold the upper and lower housings together. As one skilled in the art will appreciate, other dimensions of the slides 100 and slide tracks 101 can be adjusted to provide mechanical connection therebetween.

With reference to FIGS. 8A-9C, electrical connection is made between upper 41 and lower 42 portions of the insertable RF coil 40 concurrently with the removable mechanical coupling. Such sliding causes the pins 110a, 110b, 110c, 110d to make electrical contact with respective pin receivers 111a, 111b, 111c, 111d, as shown in positions A and B in FIG. 9C. As shown in FIG. 9C, in the initiating position A, the connector pin 110 (only one is shown for the sake of simplicity) is arranged in the x and z directions so that when the upper housing 80 is slid in the z direction with respect to the lower housing, the connector pin 110 passes through the cut-out region of the first wall 511 of the receiving region 510. The connector pin 110 is thereafter received by the prongs 540 of the female receivers 521, 522.

In the secured position B, the connector pin is disposed between the prongs 540 within the retainer 530. The width W3 of the male extension portion 420 is such that when the pin is received by the prongs within the retainer, there is a secure mechanical/electrical connection between the pin and the prongs. In other words, the retainer 530 adds stability to the pin within the prongs for maintaining the electrical connection between the prongs and the pin, while providing mechanical stability as well.

To remove the upper housing 80 from the lower housing 84, one would only have to disengage the housings by pulling the upper housing backwards (i.e. in the negative z-direction) to disengage the mechanical and electrical connectors. The upper housing can then be removed as desired.

In another embodiment, the slides 100 and the tracks 101 can be interchanged, or mixed, between the first 80 and second 84 housings of the split-top RF coil.

Figure 10:
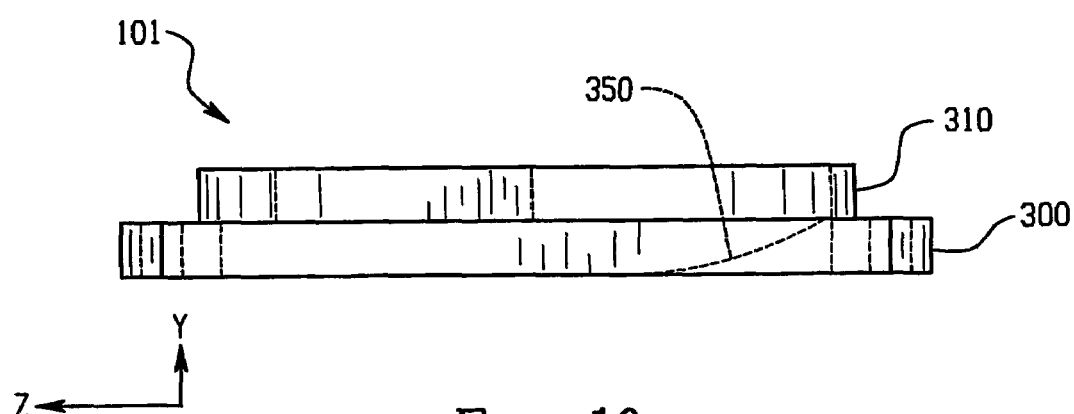
FIG. 10 is an illustration of a slide track.

In another embodiment, a ramp portion 350 is disposed within the slide track 101, as shown in FIG. 10. Here, when the upper housing is pulled back in the z-direction, the slides 100 contact ramp section in the track which forces the upper housing to elevate so that it can be picked up and removed without any resistance or seizing from the lower housing 84. Likewise, the ramp guides the upper housing with respect to the lower housing when the housing are coupled.

In another embodiment, rather than using the slides and tracks for mechanical coupling, a detent approach could be used. Here, once the upper housing 80 is slid into the correct z-position it becomes locked in position by small detents and protrusions on the upper 80 and lower 84 housings, respectively, of the insertable RF coil 40.

In another alternate embodiment, instead of using a round pin 110 as the electrical connector, one could use a rectangular blade or other male protrusions.

In another embodiment, rather than using separate pieces as the slides 100 and slide tracks 101, the slides and/or tracks can be molded, or otherwise integrated into the upper 80 and lower 84 housing portions respectively.

In another embodiment, instead of using a T type slide and track, one could use an L shape, or other various shapes, provided that there is mechanical coupling between the slides and tracks.

Instead of using spring type contact fingers, one could use a helical or leaf spring loaded contacts.

The invention has been described with reference to the preferred embodiment. Obviously, modifications and alterations will occur to others upon reading and understanding the preceding description. It is intended that the invention be construed as including all such modifications and alterations insofar as they come within the scope of the appended claims or the equivalents thereof.

What is claimed is:

1. A magnetic resonance imaging apparatus comprising:
   a magnet for generating a main magnetic field within an examination region;
   a gradient coil assembly for generating gradient magnetic fields within the examination region; and
   a split-top RF coil for at least one of transmitting and receiving RF signals within the examination region; the split-top RF coil comprising:
   a first housing having a first RF coil portion disposed therein;
   a second housing having a second RF coil portion disposed therein;
   a plurality of slides disposed on at least one of the first and second housings;
   a plurality of slide tracks disposed on at least one of the first and second housings in opposition to the plurality of slides for receiving the plurality of slides whereby the first and second housings are mechanically coupled;
   a plurality of electrical connector pins disposed on at least one of the first and second housings; and a plurality of pin receptors disposed on at least one of the first and second housing in opposition to the plurality of connector pins for receiving the plurality of pins whereby electrical connections are made between the first and second RF coil portions.

2. A split-top RF coil as set forth in claim 1 wherein at least one of the plurality of slide tracks comprises a ramp portion for guiding movement in a first direction between the first and second housings as the first and second housings are moved relative to one another in a second direction, the first and second directions being substantially perpendicular to one another.

3. A split-top RF coil as set forth in claim 1 wherein the plurality of pin receivers comprise a plurality of prongs for receiving the connector pins.

4. A split-top RF coil as set forth in claim 1 wherein the RF coil has a longitudinal axis and mechanical and electrical connections between the first and second housings are made by sliding the first and second housings with respect to one another in the direction of the longitudinal axis.

5. A split-top RF coil for use in magnetic resonance imaging comprising:
    a first housing having a first RF coil portion disposed therein;
    a second housing having a second RF coil portion disposed therein;
    a plurality of slides disposed on at least one of the first and second housings; and
    a plurality of slide tracks disposed on at least one of the first and second housings such that said tracks are opposite from the slides, the tracks for receiving the slides for mechanically coupling the first and second housings.

6. A split-top RF coil as set forth in claim 5 wherein at least one of the plurality of slide tracks comprises a ramp portion for guiding movement in a first direction between the first and second housings as the first and second housings are moved relative to one another in a second direction, the first and second directions being substantially perpendicular to one another.

7. A split-top RF coil as set forth in claim 5 further comprising:
    a plurality of electric connector pins disposed on at least one of the first and second housings; and
    a plurality of pin receivers disposed on at least one of the first and second housings such that the pin receivers are opposite from the conductor pins, the pin receivers for receiving the conductor pins for electrically connecting the first and second coil RF coil portions.

8. A split-top RF coil as set forth in claim 7 wherein the plurality of pin receivers comprise a plurality of prongs for receiving the connector pins.

9. A split-top RF coil as set forth in claim 7 wherein the RF coil has a longitudinal axis and mechanical and electrical connections between the first and second housings are made by sliding the first and second housings with respect to one another in the direction of the longitudinal axis.

10. A split-top RF coil for use in magnetic resonance imaging having a first axis, the RF coil comprising:
    a first housing having a first RF coil portion disposed therein;
    a second housing having a second RF coil portion disposed therein;
    mechanical coupling means for mechanically coupling the first and second housings by moving the first housing with respect to the second housing in the direction of the first axis; and
    electrical coupling means for electrically coupling the first and second RF coil portions by moving the first housing with respect to the second housing in the direction of the first axis.

11. A split-top RF coil as set forth in claim 10 wherein the mechanical coupling means comprises:
    a plurality of slides disposed on at least one of the first and second housings; and
    a plurality of slide tracks disposed on at least one of the first and second housings such that said tracks are opposite from the slides, the tracks for receiving the slides for mechanically coupling the first and second housings.

12. A split-top RF coil as set forth in claim 11 wherein at least one of the plurality of slide tracks comprises a ramp portion for guiding movement in a first direction between the first and second housings as the first and second housings are moved relative to one another in a second direction, the first and second directions being substantially perpendicular to one another.

13. A split-top RF coil as set forth in claim 11 wherein the electrical coupling means comprises:
    a plurality of electric connector pins disposed on at least one of the first and second housings; and
    a plurality of pin receivers disposed on at least one of the first and second housings such that the pin receivers are opposite from the conductor pins, the pin receivers for receiving the conductor pins for electrically connecting the first and second coil RF coil portions.

14. A split-top RF coil as set forth in claim 13 wherein the plurality of pin receivers comprise a plurality of prongs for receiving the connector pins.

15. A split-top RF coil as set forth in claim 7 wherein the first axis is defined by a longitudinal axis of the RF coil.

\* \* \* \* \*